(12) United States Patent
Bhatti et al.

(10) Patent No.: US 7,129,784 B2
(45) Date of Patent: Oct. 31, 2006

(54) MULTILEVEL POWER AMPLIFIER ARCHITECTURE USING MULTI-TAP TRANSFORMER

(75) Inventors: Iqbal Bhatti, Los Angeles, CA (US); Jesus Castaneda, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 37 days.

(21) Appl. No.: 10/975,240

(22) Filed: Oct. 28, 2004

(65) Prior Publication Data

US 2006/0091958 A1    May 4, 2006

(51) Int. Cl.
*H03F 3/68* (2006.01)
(52) U.S. Cl. ....................................... 330/295; 330/195
(58) Field of Classification Search ................ 330/295, 330/301, 276, 286
See application file for complete search history.

(56) References Cited

U.S. PATENT DOCUMENTS 5,570,062 A * 10/1996 Dent ............................ 330/51
6,882,263 B1 * 4/2005 Yang et al. .................. 336/200

* cited by examiner

*Primary Examiner*—Robert Pascal
*Assistant Examiner*—Hieu Nguyen
(74) *Attorney, Agent, or Firm*—Bruce Garlick; Garlick, Harrison & Markison (57) ABSTRACT

A multi-level power amplifier architecture using a multi-tap transformer implemented on a single CMOS integrated circuit wireless communications device is described. By providing a multi-tap transformer for coupling a plurality of power amplifiers to a shared output impedance, such as an antenna, power transmission may be made at different levels while maintaining efficiency. With a multi-tap transformer having "N" taps featuring "N" different impedance levels, each tap may be connected to an amplifier cell which delivers power into the transformer at the tap for coupling to the output load. Any one of the "N" amplifier cells can be turned on at once along with any combination of the "N" amplifier cells.

18 Claims, 9 Drawing Sheets

MULTILEVEL POWER AMPLIFIER ARCHITECTURE USING MULTI-TAP TRANSFORMER

BACKGROUND OF THE INVENTION

1. Field of the Invention

The present invention is directed in general to wireless communication technology. In one aspect, the present invention relates to transformers used with the radio communication transmitters and receivers.

2. Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth (BT), advanced mobile phone services (AMPS), digital AMPS, global system for mobile communications (GSM), code division multiple access (CDMA), local multipoint distribution systems (LMDS), multi-channel-multipoint distribution systems (MMDS) and/or variations thereof.

Depending on the type of wireless communication system, a wireless communication device (such as a cellular telephone, two-way radio, personal digital assistant (PDA), personal computer (PC), laptop computer, home entertainment equipment, etc.) communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over the tuned channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network, via the Internet, and/or via some other wide area network.

Wireless communication devices typically communicate with one another using a radio transceiver (i.e., receiver and transmitter) that includes a transmitter section, a receiver section, a transformer for the receiver section, a transformer for the transmitter section, an antenna switch, and an antenna, all or part of which may be incorporated in, or coupled to, the wireless communication device. The antenna receives RF signals that are then coupled to the receiver section by the antenna switch. The antenna also transmits amplified RF signals received from the transmitter section via the antenna switch.

The receiver and transmitter transformers may be implemented as a balun (balanced/unbalanced) transformer which is generally used to convert single ended signals into differential signals and conversely to convert differential signals into single ended signals. For example, RF signals received via the antenna are converted into differential signals, which are provided to a low noise amplifier of the receiver section. Conversely, differential signals from a power amplifier of the transmitter section are converted into single ended signals, which are provided to the antenna.

The transmitter section typically includes a data modulation stage, one or more intermediate frequency stages and a power amplifier. The data modulation stage converts raw data into baseband signals in accordance with a particular wireless communication standard. The intermediate frequency stages mix the baseband signals with one or more local oscillations to produce RF signals. In direct conversion transmitters/receivers, conversion directly between baseband signals and RF signals is performed. The power amplifier amplifies the RF signals prior to transmission via an antenna.

The receiver section typically includes a low noise amplifier, one or more intermediate frequency stages, a filtering stage and a data recovery stage. The low noise amplifier receives inbound RF signals via the antenna and amplifies them. The intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

In addition to the computational requirements and design complexity for wireless communication systems, such as described above, the ever-increasing need for higher speed communications systems imposes additional performance requirements and resulting costs for communications systems. In order to reduce costs, communications systems are increasingly implemented using Very Large Scale Integration (VLSI) techniques. The level of integration of communications systems is constantly increasing to take advantage of advances in integrated circuit manufacturing technology and the resulting cost reductions. This means that communications systems of higher and higher complexity are being implemented in a smaller and smaller number of integrated circuits. For reasons of cost and density of integration, the preferred technology is CMOS.

Increasingly, the implementation of wireless communication devices as integrated circuit systems has posed design challenges for integrating the inductor components of such circuits. For example, inductors are included in the mixers in the IF stages of both the receiver and transmitter, the power amplifier, a voltage control oscillator of a local oscillation module, the low noise amplifier, and the filters each include one or more inductors. Many attempts have been made to integrate transformers and/or transformer baluns onto radio frequency integrated circuits; however, such integration has been limited due to flux leakage, capacitive coupling limits, and significant series resistance. While these limitations have been partially addressed with transformer IC designs (including coplanar interleaved transformers, toroidal and concentric transformers, overlay transformers and symmetric coplanar transformers), these designs have their own drawbacks. For example, coplanar interleaved transformers suffer from a low quality (Q) factor have small coupling coefficients. Another drawback of conventional power amplifier architecture solutions is that they do not efficiently provide power at all power levels required by differing applications. For example, conventional power amplifier solutions are designed to have maximum efficiency at the highest desired output level, so that when the power level is reduced from its maximum level, the power efficiency is also reduced. As a result, conventional power amplifier solutions do not allow for power output efficiency to be maintained across multiple power levels.

Therefore, a need exists for an improved power amplification method and system for use with radio transceiver circuits in wireless communication devices. In addition, a need exists for a multi-use on-chip transformer that may adjustably provide different inductance values with a small size, optimal shape, high quality factor, reduced resistance and a high coupling coefficient. There is also a need for an improved impedance matching system for use in power amplifier applications whereby power amplifier efficiency is maintained as the power level changes. There is also a need for a power amplification method and system that is capable of performing the above functions and overcoming these difficulties using circuitry implemented in integrated circuit form. Further limitations and disadvantages of conventional systems will become apparent to one of skill in the art after reviewing the remainder of the present application with reference to the drawings and detailed description which follow.

SUMMARY OF THE INVENTION

Broadly speaking, the present invention provides an improved power amplifier architecture and methodology using a multi-tap transformer and inductor to control power transmission at different levels while maintaining efficiency. In a selected embodiment, a transformer having "N" taps may be used to provide "N" different impedance levels by connecting the transformer between a plurality of amplifier cells and an output load. By connecting each transformer tap to an amplifier cell, power from that cell is delivered through the transformer to the output load in such a way that power efficiency is maintained, regardless of which of the "N" amplifier cells is turned on at once. In addition, any one of the "N" amplifier cells can be turned on at once along with any combination of the "N" amplifier cells to achieve intermediate power levels between the power steps provided by each of the "N" power amplifier cells.

In accordance with an illustrative embodiment of the present invention, an on-chip multi-tap transformer is provided for efficiently delivering power from a plurality of power amplifiers to a shared output impedance (such as an antenna) through an on-chip multiple tap transformer, all on a single CMOS integrated circuit wireless communications device. The multi-tap transformer may include a primary winding formed on a first layer of an integrated circuit that is coupled to the shared output impedance. The multi-tap transformer may also include a secondary winding that is formed on a second layer of the integrated circuit, and that includes a plurality of input taps, where each input tap is coupled to one of a plurality of power amplifiers. For example, the secondary winding may have a generally octagonal geometric shape, and may include a common node (coupled to a ground reference potential), a first portion, a second portion, where each portion has one node, a first tap and a second tap. The nodes from the first and second portions may be coupled to receive a first differential input signal, the first taps of the first and second portions may be coupled to receive a second differential input signal, and the second taps of the first and second portions may be coupled to receive a third differential input signal. As a result, each input tap provides a different, predetermined impedance level for connecting the power amplifier coupled to the input tap through to the shared output impedance. With this configuration, a plurality of differential input signals or single-ended input signals may be applied to the multi-tap transformer, and any one or more of the input signals from the power amplifiers can be turned on at once using the variable load impedance of the multi-tap transformer.

The objects, advantages and other novel features of the present invention will be apparent from the following detailed description when read in conjunction with the appended claims and attached drawings.

DETAILED DESCRIPTION

A method and apparatus for an improved power amplifier architecture is described. While various details are set forth in the following description, it will be appreciated that the present invention may be practiced without these specific details. For example, selected aspects are shown in block diagram form, rather than in detail, in order to avoid obscuring the present invention. Some portions of the detailed descriptions provided herein are presented in terms of schematic descriptions and cross-sectional depictions which are used by those skilled in the field of communication systems to describe and convey the substance of their work to others skilled in the art.

Figure 1:
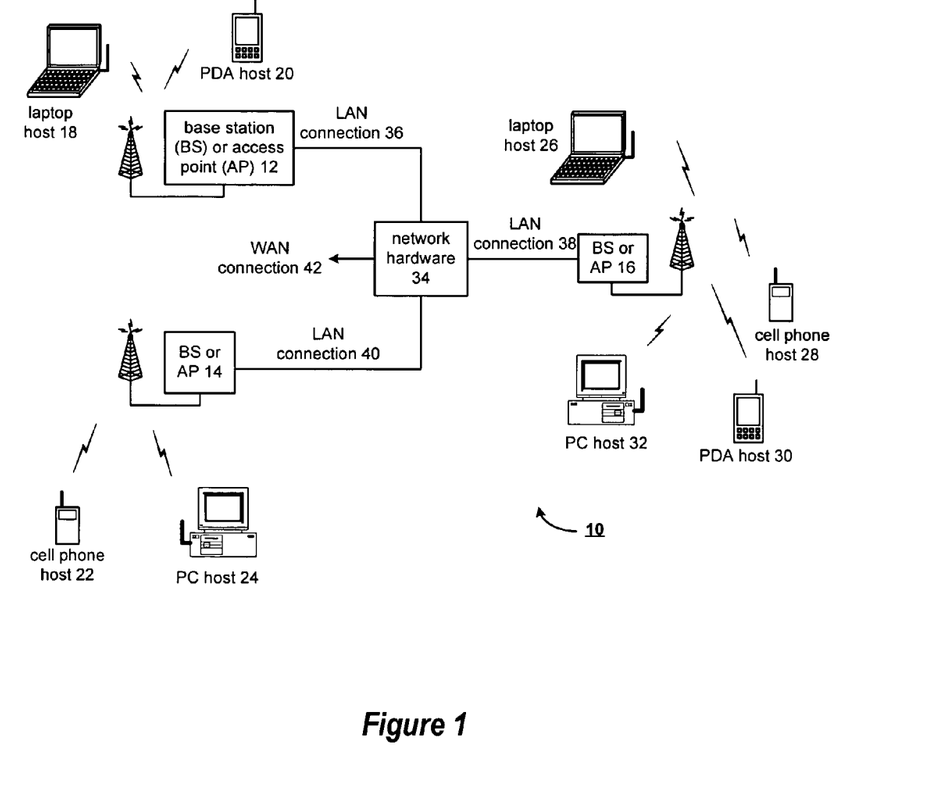
FIG. 1 is a schematic block diagram of a wireless communication system in accordance with an illustrative embodiment of the present invention.

FIG. 1 illustrates a wireless communication system 10 in which embodiments of the present invention may operate. As illustrated, the wireless communication system 10 includes a plurality of base stations and/or access points 12, 14, 16, a plurality of wireless communication devices 18–32 and a network hardware component 34. The wireless communication devices 18–32 may be laptop host computers 18 and 26, personal digital assistant hosts 20 and 30, personal computer hosts 32, cellular telephone hosts 28, an 802.11a WLAN device 22 and/or an 802.11g WLAN device 24. The details of the wireless communication devices will be described in greater detail with reference to FIGS. 2–15.

As illustrated, the base stations or access points 12, 14, 16 are operably coupled to the network hardware 34 via local area network connections 36, 38, 40. The network hardware 34 (which may be a router, switch, bridge, modem, system controller, etc.) provides a wide area network connection 42 for the communication system 10. Each of the base stations or access points 12, 14, 16 has an associated antenna or antenna array to communicate with the wireless communication devices in its area. Typically, the wireless communication devices register with a particular base station or access point 12, 14, 16 to receive services from the communication system 10. For direct connections (i.e., point-to-point communications), wireless communication devices communicate directly via an allocated channel. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
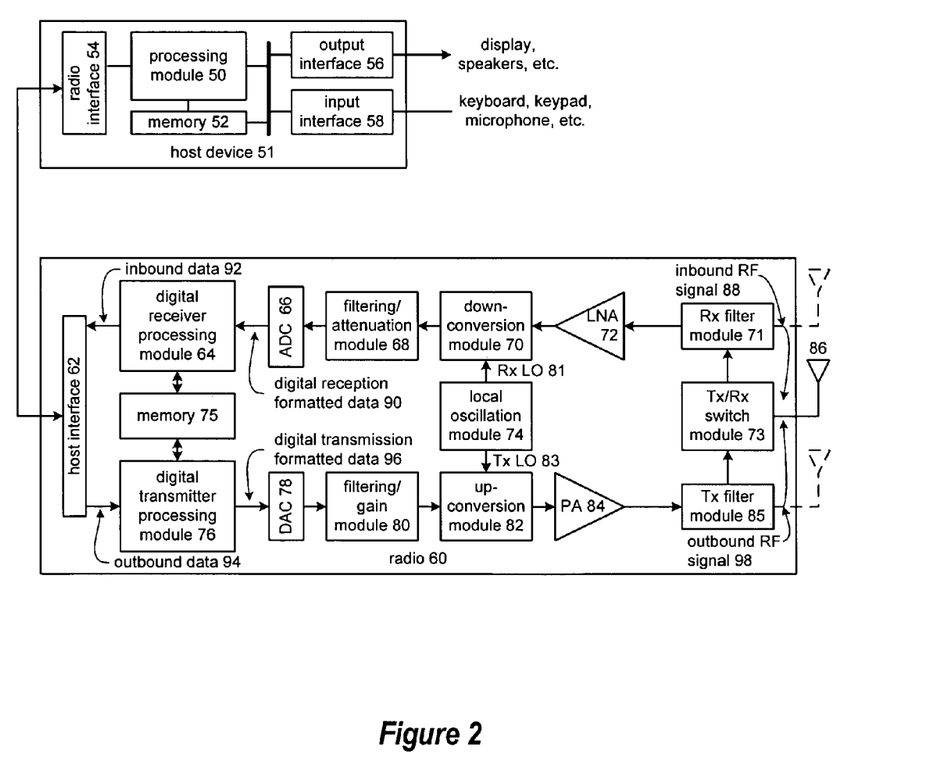
FIG. 2 is a schematic block diagram of a wireless communication device in accordance with an illustrative embodiment of the present invention.

FIG. 2 is a schematic block diagram illustrating a wireless communication device that includes the host device 51 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 51 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device (such as a display, monitor, speakers, etc.) such that the received data may be displayed. The radio interface 54 also provides data from the processing module 50 to the radio 60. The processing module 50 may receive the outbound data from an input device (such as a keyboard, keypad, microphone, etc.) via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down-conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up-conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. When the processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a/b/g, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80, which may be implemented in accordance with the teachings of the present invention, filters and/or adjusts the gain of the analog signal prior to providing it to the IF mixing stage 82. The IF mixing stage 82, which may be implemented in accordance with the teachings of the present invention, directly converts the analog baseband or low IF signal into an RF signal based on a transmitter local oscillation 83 provided by local oscillation module 74. The power amplifier 84, which may be implemented in accordance with the teachings of the present invention, amplifies the RF signal to produce an amplified outbound RF signal. The amplified outbound RF signal is filtered by the transmitter filter module 85, which may be implemented in accordance with the teachings of the present invention. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71, which may be implemented in accordance with the teachings of the present invention, bandpass filters the inbound RF signal 88. The Rx filter 71 provides the filtered RF signal to low noise amplifier 72, which amplifies the signal 88 to produce an amplified inbound RF signal. The low noise amplifier 72, which may be implemented in accordance with the teachings of the present invention, provides the amplified inbound RF signal to the IF mixing module 70, which directly converts the amplified inbound RF signal into an inbound low IF signal or baseband signal based on a receiver local oscillation 81 provided by local oscillation module 74. The down-conversion module 70, which may be implemented in accordance with the teachings of the present invention, provides the inbound low IF signal or baseband signal to the filtering/attenuation module 68. The filtering/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 51 via the radio interface 54.

As one of ordinary skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
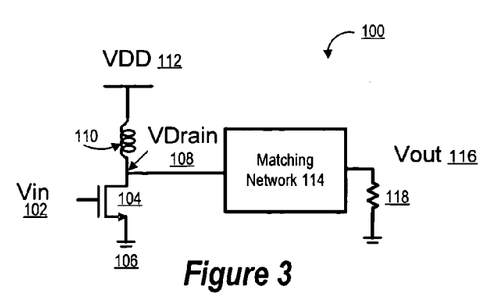
FIG. 3 is a simplified schematic block diagram of a power amplifier that is provided for illustration purposes.

FIG. 3 is a simplified schematic block diagram of an illustrative power amplifier 100, such as may be used in wireless communication systems to amplify the power delivered to a relatively low impedance circuit element (e.g., 50 ohms antenna for signal transmission). Power amplifier 100 receives an input $V_{IN}$ 102 and uses an NMOS transistor device 104, inductor 110 and a matching network 114 to produce an output $V_{OUT}$ 116 across a load resistance 118. The NMOS device 104 is biased with the DC voltage $V_{IN}$ 102, and the drain $V_{DRAIN}$ 108 of the NMOS device 104 is connected to an inductor 110 which connects to the power supply $V_{DD}$ 112. Ideally, a lossless matching network 114 would be placed in between the drain of the NMOS device ($V_{DRAIN}$ 108) and the output load resistor 118. The network 114 is used to tune out unwanted parasitics and to transform the load impedance to a more desirable level from the point of view of the transistor. The power amplifier 100 will be used to demonstrate that output power efficiency may be maximized by varying the load impedance presented by the matching network 114.

To calculate the efficiency of the power amplifier 100 having a sinusoidal output signal $V_{OUT}$ 116, the power delivered into the matching network 114 is first determined using the expression:

$$Pin = \frac{Vdrain^2}{2*Rnetwork},$$

where Rnetwork is the load impedance presented by the matching network 114, and Vdrain is the AC signal peak amplitude at the drain $V_{DRAIN}$ 108. If the network 114 is assumed to be a lossless network, then the same amount of power that is sent into the network 114 is delivered to the load 118. If the input power supplied by $V_{DD}$ 112 is the product of the DC voltage, "VDD," and DC current, "I":

$$Psupply = VDD*I,$$

then the efficiency is given by the ratio of the input power delivered into the matching network 114 divided by the power taken from the supply:

$$Efficiency = \frac{\frac{Vdrain^2}{2*Rnetwork}}{VDD*I}.$$

Since Vdrain is the product of the AC drain current, Idrain, and Rnetwork, the Efficiency expression can be rewritten as:

$$Efficiency = \frac{(Idrain*Rnetwork)(Vdrain)}{(VDD*I)(2*Rnetwork)}.$$

Assuming that the NMOS transistor device 104 is biased and operates such that it perfectly converts all the DC current from the load into AC signal current, then the maximum and best possible value of Idrain is I, the DC supply current. As a result, the Efficiency expression reduces to:

$$\text{Efficiency} = \frac{1}{2} * \frac{(V drain)}{(VDD)}.$$

This reduced Efficiency expression indicates that, if the NMOS transistor device 104 is perfectly efficient in terms of current, the power efficiency depends on the ratio of the AC voltage swing at the drain to the supply voltage. Furthermore, to maximize the efficiency, the AC swing at the drain of the transistor must be maximized, taking into account the presence of the inductor 110 in the power amplifier 100.

In particular, the inductor 110 connects the drain 108 of the NMOS transistor device 104 to the supply voltage $V_{DD}$ 112, meaning that the nominal DC value of the drain voltage at node 108 is $V_{DD}$. As the AC amplitude of the signal at the drain node 108 grows, it reaches a maximum voltage value of $V_{DD}$. And when the peak negative half of the AC cycle reaches a maximum of $V_{DD}$, the instantaneous voltage at the drain 108 (which is the superposition of the DC bias and AC swing) becomes zero, and can go no lower. Because the signal swing at the drain 108 of the NMOS transistor device 104 should be a sine wave, the maximum positive AC swing is also $V_{DD}$. As a result, the largest possible AC signal at the drain 108 has an amplitude of $V_{DD}$, and the drain 108 of the transistor 104 is biased at $V_{DD}$ swinging from ground up to $2*V_{DD}$. This means that the maximum input power delivered to the network 114 is:

$$Pin\max = \frac{VDD^2}{2*Rnetwork}.$$

Based on the foregoing, if all the available AC swing at the drain 108 of the transistor 104 is used, then the maximum output power depends only on the supply voltage $V_{DD}$ and the transformed load impedance Rnetwork. In other words, if power efficiency is to be maintained by maximizing the signal swing at the drain 108, then the output power can only be efficiently changed by adjusting the $V_{DD}$ and Rnetwork parameters.

Changing $V_{DD}$ can be difficult. For example, a voltage regulator could be used, but the regulator has it own conversion efficiency which must be taken into account. And as will be appreciated by those of ordinary skill in the art, it is usually desirable to use the highest DC supply available for $V_{DD}$ since that reduces the current drain for a given output power level. For example, with mobile devices, current usage determines the battery life, so a higher DC supply reduces the current requirement needed for a given power level. Alternatively, reducing the input AC signal can reduce the power, but this also reduces the AC signal swing at the drain, thereby reducing the efficiency.

In accordance with the present invention, Rnetwork is the parameter of choice for changing the output power level. However, as explained above, conventional power amplifier designs have a load impedance, Rnetwork, for the matching network 114 that provides maximum power efficiency at the highest output power level, but the efficiency drops as the output power to the antenna decreases. In accordance with various embodiments of the present invention, a variable load impedance is disclosed for providing varying component values in the matching network 114. Rather than using a lossy MOS switch implementation, selected embodiments of the present invention use a multi-tap transformer to provide an adjustable low loss load impedance in place of the matching network so that power efficiency may be maintained while the output power varies.

Figure 4:
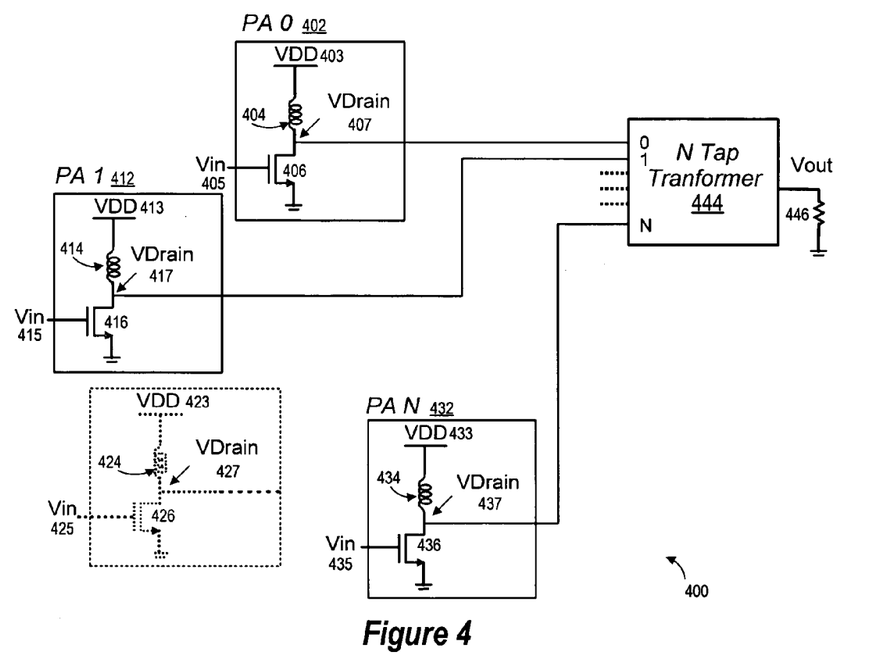
FIG. 4 is a simplified schematic block diagram of an exemplary power amplification system that connects a plurality of different power amplifiers through a multi-tap transformer to a shared output load in accordance with an illustrative embodiment of the present invention.

FIG. 4 is a simplified schematic block diagram of an exemplary power amplification system that connects a plurality of different power amplifiers 402, 412, 422, 432 through a multi-tap transformer 444 to a shared output load 446. Each power amplifier (e.g., 402) includes a power supply $V_{DD}$ (e.g., 403), an inductor (e.g., 404) and an input transistor (e.g., 406). The input transistor (e.g., 406) is operably coupled to receive a power amplifier input voltage $V_{IN}$ (e.g., 405), which may be provided for amplification (e.g., from the up-conversion module 82 in FIG. 2). The input transistor 406 amplifies the input voltage $V_{IN}$ 405 based on the transistor gain and the load provided by the inductor 404. The inductor 404 is coupled to the drain of each input transistor (e.g., at node $V_{DRAIN}$ 407), which in turn is connected to a tap of a multi-tap transformer 444. In an alternative embodiment, a separate inductor 404 may not be required because the transformer winding can be used to replace the inductor and/or the transformer section can be driven by non-inductively loaded power amplifiers. In a selected embodiment, the multi-tap transformer 444 may be constructed as described herein with reference to FIGS. 6–15 and is coupled to the plurality of power amplifiers 402, 412, 422, 432 so that each input voltage $V_{IN}$ 405, 415, 425, 435 is coupled to efficiently amplify the input power through a dedicated load impedance Rnetwork of the transformer 444, depending on which terminal tap(s) of the secondary winding of transformer 444 is coupled to the amplifier.

In particular, by using a multi-tap transformer 444 having N taps, each one of the N taps may be stimulated by N power amplifiers (e.g., 402, 412, 422, 432). In this way, any one of the N tap/power amplifier pairs can be activated to deliver power into the secondary side of the transformer 444, which is then coupled to the load resistance 446 through the primary side of the transformer 444. Furthermore, any one of the N pairs can be optimized to be highly efficient. Since each of the N taps presents a different impedance, N different power levels can efficiently be delivered to the load 446. In addition, various combinations of any of the N pairs can be turned on to deliver different combinations of powers to the primary side of the transformer 444, thereby providing at least N different power levels. Since each power amplifier is optimized for efficiency, any of the N power levels is efficient.

Figure 5:
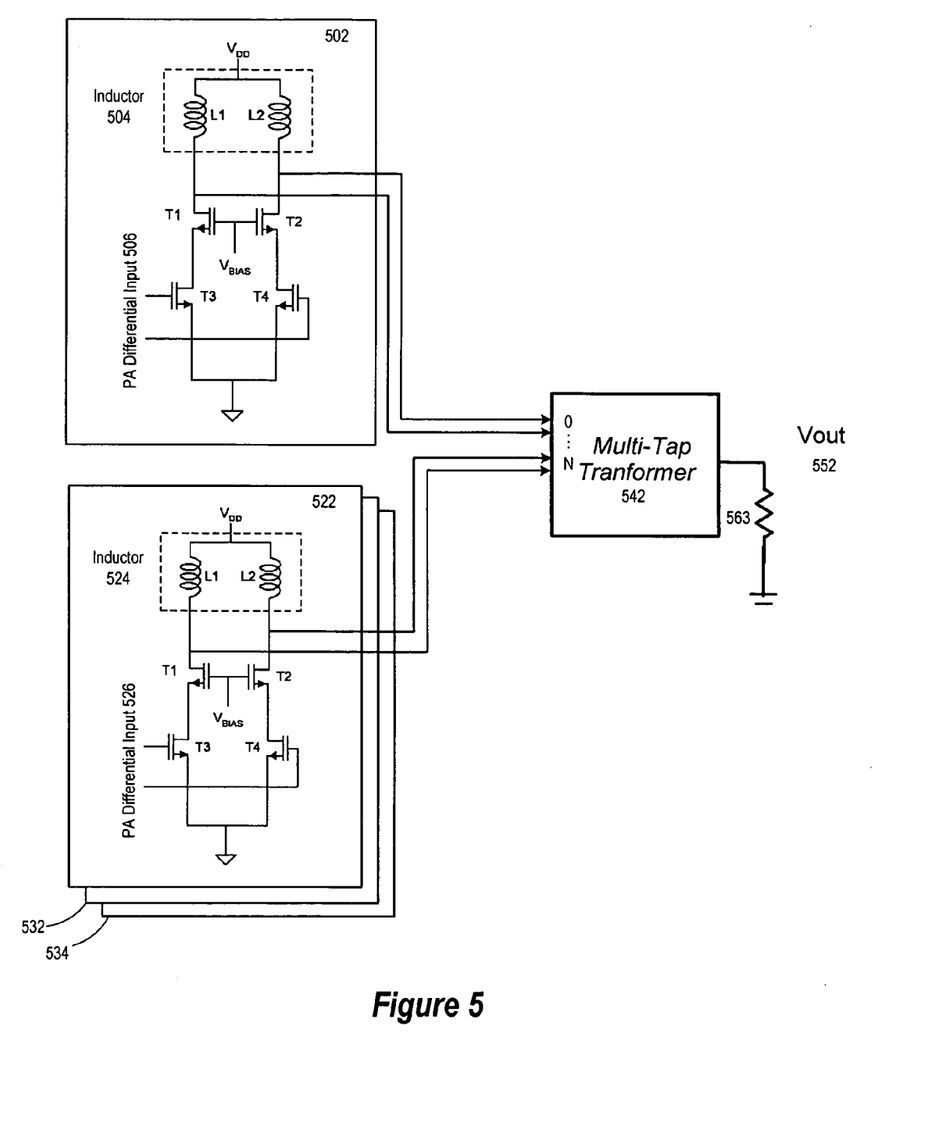
FIG. 5 is a simplified schematic block diagram of an exemplary power amplification system that connects a plurality of differential power amplifiers to a multi-tap transformer in accordance with an illustrative embodiment of the present invention.

FIG. 5 illustrates a simplified schematic block diagram of a plurality of differential power amplifiers 502, 522, 532, 534 that are connected through a multi-tap transformer 542 to a shared output load 562 (e.g., antenna 86 in FIG. 2), where each differential power amplifier (e.g., 502) includes an inductor 504, input transistors T3 and T4 and current control transistors T1 and T2. The input transistors T3 and T4 are operably coupled to receive a differential input 506 (e.g., from the up-conversion module 82 in FIG. 2), which may be provided for power amplification (e.g., to generate differential outbound RF signal 98 from the power amplifier module 84 in FIG. 2). The input transistors T3 and T4 amplify the differential input 506 based on their respective gains and the load provided by the differential inductor 504. The inductor 504 may be implemented as separate inductor elements or may be constructed in accordance with the teachings of U.S. patent application Ser. No. 10/200,802 entitled "On-Chip Differential Inductor and Applications Thereof," (now U.S. Pat. No. 7,039,381), which is hereby incorporated fully by reference as if set forth herein. By using a multi-tap transformer 542 having N taps, one or more of the N taps may be stimulated by N power amplifiers (e.g., 502, 522, 532, 534) to deliver power into the secondary side of the transformer 542, which is then coupled to the load resistance 562 through the primary side of the transformer 542.

Figure 6:
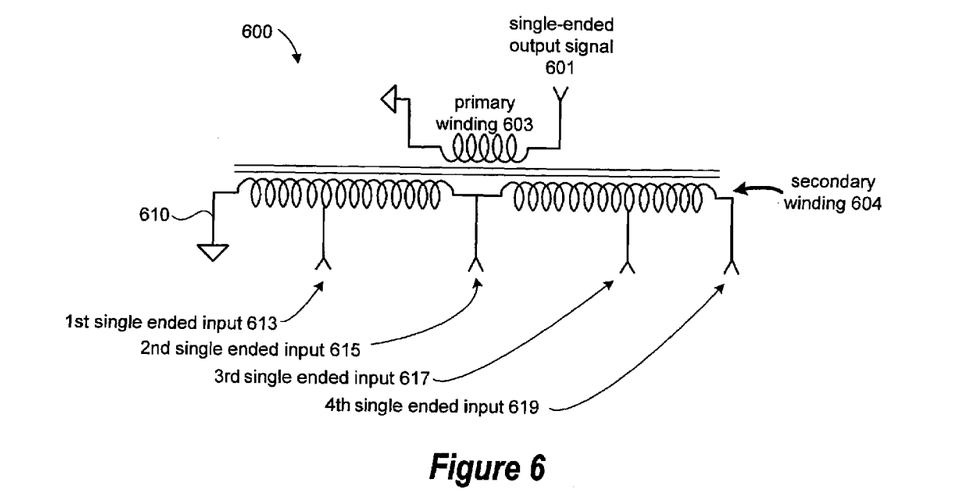
FIG. 6 is a schematic diagram of a multi-tap transformer in accordance with an illustrative embodiment of the present invention.

FIG. 6 is a schematic diagram of an on-chip multi-tap transformer 600 that is operably coupled to convert a plurality of single ended input signals 613, 615, 617, 619 into a single ended output signal 601. The transformer 600 includes a primary winding 603 and a secondary winding 604. The secondary winding 604 includes a first portion and a second portion, each of which includes two nodes and a tap. In a selected embodiment, a ground node 610 of the secondary winding 604 is coupled to a reference potential (e.g., AC ground). The input voltages from the single ended power amplifiers are operably coupled to the remaining nodes and taps of the first and second portions of the secondary winding 604, thereby providing input voltages with reference the input ground 610. As will be appreciated, the taps 613, 617 may be implemented symmetrically with reference to the nodes 610, 615, 619, though asymmetric configurations may also be used to couple one or more input voltages 613, 615, 617, 619 to the output signal 601. The turn ratio between the any input voltage on the secondary winding and the primary winding 603 controls the load impedance provided by the transformer 600. In an illustrative implementation, the primary winding 603 may consist of two turns while the secondary winding 604 consists of nine turns, though those of ordinary skill in the art will appreciate that other combinations of turn ratios may be used. While the transformer 600 may be used for a single power amplifier by having the other inputs disabled during the required operations, in other applications, more than one power amplifier may be applied as inputs to the transformer 600 to thereby efficiently combine the power amplification operations.

Figure 7:
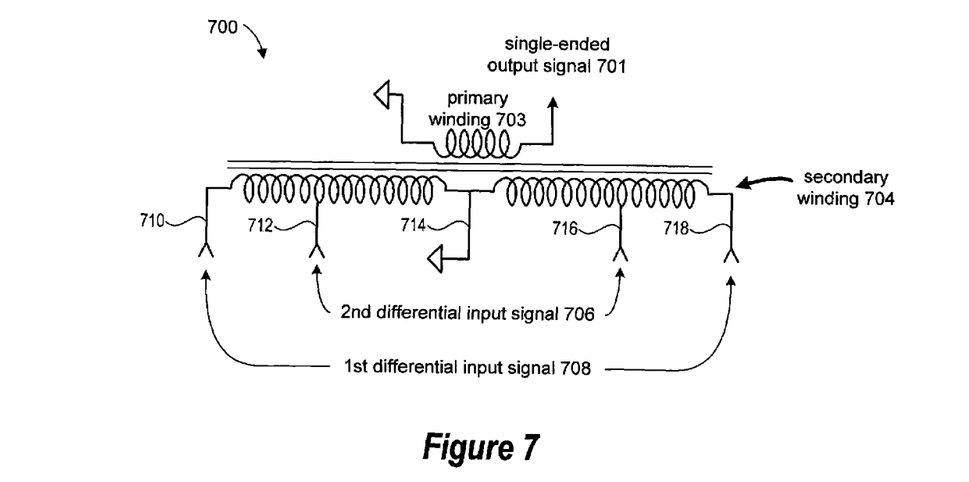
FIG. 7 is a schematic diagram of an alternate multiple tap transformer balun in accordance with an illustrative embodiment of the present invention.

FIG. 7 illustrates a schematic diagram of an alternate on-chip multiple tap transformer balun 700 that is operably coupled to convert one or more differential input signals 706 or 708 into a single ended output signal 703. In this embodiment, the transformer 700 includes a primary winding 703 and a secondary winding 704 such that a first differential input signal 708 or second differential input signal 706 may be coupled to the secondary winding 704. As such, the primary winding 703 produces a single ended output signal 703 corresponding to either the first differential input signal 708 or the second differential input signal 706.

The secondary winding 704 includes a first and second portion, each having a first node, a second node, and a tap. The second nodes 714 of the respective portions of the secondary winding 704 are operably coupled to the AC ground reference potential, and the first nodes 710, 718 of the respective portions are coupled to receive the first differential input signal 708. The taps 712, 716 of each portion of the secondary winding 704 are operably coupled to receive the second differential input signal 706. As will be appreciated, the first and second differential input signals 706, 708 may be used individually or simultaneously to provide inputs to the transformer 700. The resulting single ended output signal 703 will represent a mixing of the first and second differential input signals 706, 708.

Figure 8:
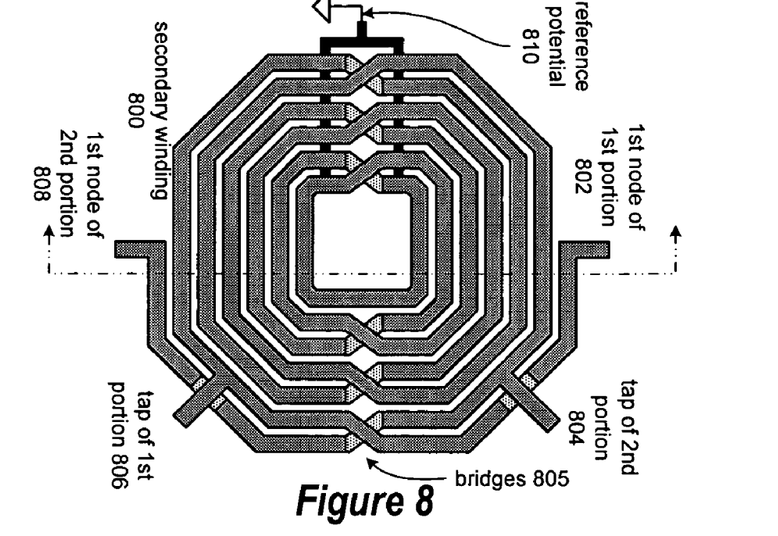
FIG. 8 illustrates a top view of a multi-tap secondary winding of a multi-tap transformer balun or inductor in accordance with an illustrative embodiment of the present invention.
Figure 9:
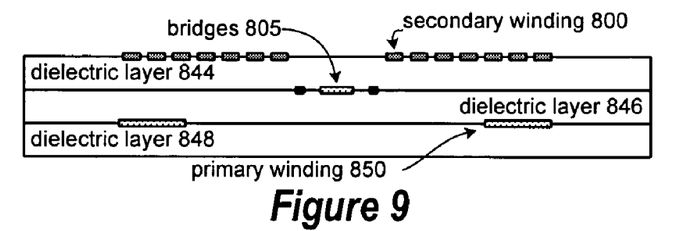
FIG. 9 illustrates a cross sectional view of a multi-tap transformer balun or inductor in accordance with an illustrative embodiment of the present invention.
Figure 10:
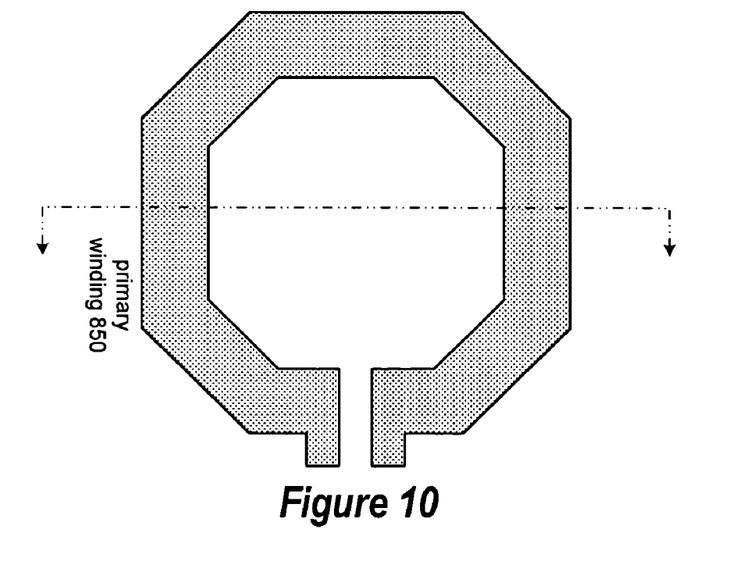
FIG. 10 illustrates a bottom view of a primary winding of an on-chip multi-tap transformer balun in accordance with an illustrative embodiment of the present invention.

FIGS. 8–10 illustrate a physical embodiment of the multi-tap transformers 600 or 700 of FIGS. 6 and 7, which may be used to couple multiple power amplifiers to an output load. For example, the depicted transformer can be used to couple up to two differential power amplifiers, or up to four single ended power amplifiers, to an output load. FIG. 8 illustrates the top view of the secondary winding 800. As shown, the secondary winding 800 includes a first node of a second portion 808, a tap of the first portion 806, bridges 805, a tap of the second portion 804, a first node of the first portion 802, and a coupling to a reference potential 810. The number of turns for the secondary winding 800 may vary from one to multiple turns. The secondary winding 800 may be fabricated using a metallization layer of the integrated circuit having low resistivity. Typically, for a CMOS process, this particular metallization layer is the top metal layer.

FIG. 8 illustrates a top view of a multi-tap secondary winding 800 of a physical embodiment for a multi-tap differential inductor. For this inductor, the first winding corresponds to the first portion (e.g., starting at node 802) of the secondary winding 800 and the second winding corresponds to the second portion (e.g., starting at node 808). As will be discussed in greater detail with reference to FIGS. 11 and 12, if FIG. 8 is constructed to implement a multi-tap differential inductor, the secondary winding 800 may include shunt windings on different layers. By using shunt windings, the series resistance of the inductor decreases, thereby increasing the quality factor of the inductor.

FIG. 9 illustrates a cross sectional view of multi-tap transformers 600 or 700 to include an upper dielectric layer 844, a middle dielectric layer 846, and a lower dielectric layer 848. The upper dielectric layer 844 supports a metallization layer that is used to fabricate the secondary winding 800. The middle dielectric layer 846 supports the bridges 842 and the coupling to the reference potential 810. The lower dielectric layer 848 supports the primary winding 850.

FIG. 10 illustrates a bottom view of multi-tap transformers 600 or 700 and illustrates the geometric shape of an embodiment of the primary winding 850. The primary winding 850 is shown to include one turn, but may include multiple turns, depending on the desired turn ratio for multi-tap transformers 600 or 700.

Figure 11:
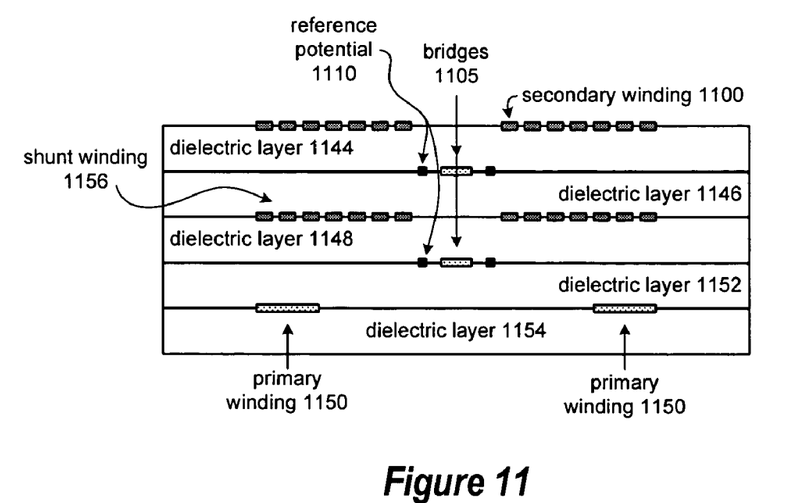
FIG. 11 illustrates a cross sectional view of a multi-layered multiple tap transformer balun in accordance with an illustrative embodiment of the present invention.

FIG. 11 illustrates an alternate cross sectional view of a multi-tap transformer in accordance with the present invention where the secondary winding 1100 includes a shunt winding 1156. In this embodiment, five support dielectric layers 1144, 1146, 1148, 1152 and 1154 are illustrated. As shown, the secondary winding 1100 is supported by the first dielectric layer 1144, the shunt winding 1156 is supported by the third dielectric layer 1148, the corresponding bridges 1105 and the reference potential couplings 1110 are supported by the second and fourth dielectric layers 1152, 1146, and the primary winding 1150 is supported by the fifth dielectric layer 1154. The shunt winding 1156 is coupled in parallel with the secondary winding 1100 to reduce the resistivity of the secondary winding 1100.

Figure 12:
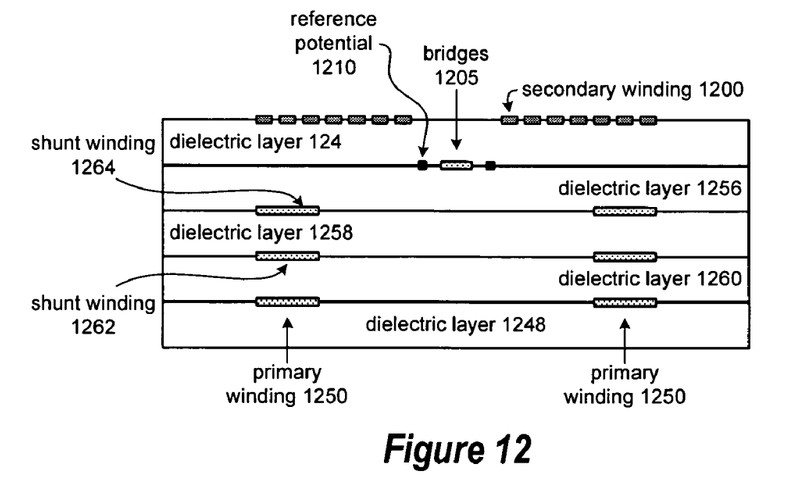
FIG. 12 illustrates a cross sectional view of an alternate multi-layered multi-tap transformer balun in accordance with an illustrative embodiment of the present invention.

FIG. 12 illustrates an alternate cross sectional view of a multi-tap transformer that includes the primary winding 1250 including one or more shunt windings. In this example, the primary winding includes two shunt windings 1262, 1264. As shown, the additional shunt windings are supported by dielectric layers 1258 and 1260. As will be appreciated, the secondary winding 1200 and the primary winding 1250 may include shunt windings. As such, a transformer incorporating a combination of FIGS. 11 and 12 may also be implemented.

Figure 13:
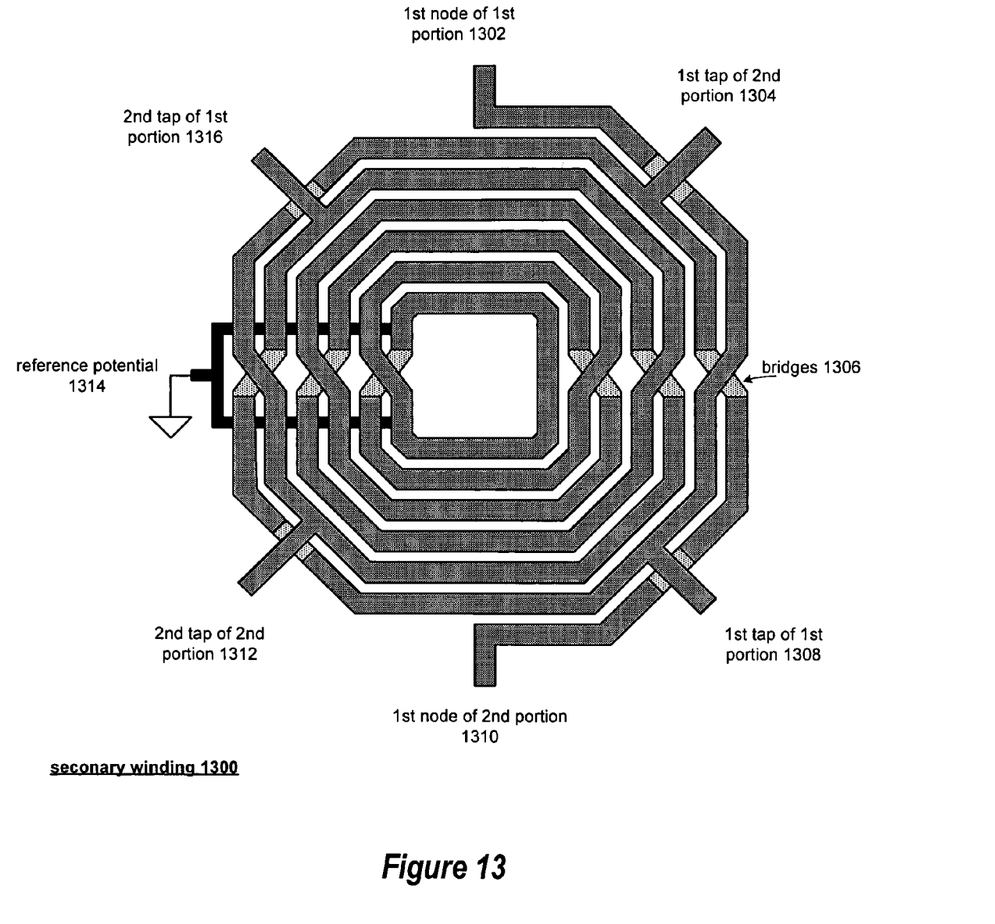
FIG. 13 depicts an alternate secondary winding for an on-chip multi-tap transformer balun or an on-chip multi-tap inductor in accordance with an illustrative embodiment of the present invention.

FIG. 13 illustrates an alternate embodiment of the secondary winding 1300 or the multi-tap differential inductor that may be used to receive multiple input voltage signals. In this configuration, the geometric shape corresponds to a rectangular octagonal shape. The particular length and width of the rectangular octagonal shape is based on a balancing of the inductance value, the turn ratio, the quality factor and capacitance of the windings. The second winding 1300 includes a first portion and a second portion, where each portion has one node and two taps. As shown, the secondary winding includes a first node of the first portion 1302, a first tap of the second portion 1304, bridges 1306, a first tap of the first portion 1308, a first node of the second portion 1310, a second tap of the second portion 1312, a coupling to a reference potential 1314, and a second tap of the first portion 1316. The bridges 1306 are used to couple the various windings together and to maintain symmetry of the second winding 1300.

As illustrated in FIG. 13, the present invention provides an on-chip multi-tap inductor that may be used for the N-tap transformer illustrated in FIGS. 4–5. In particular, the inductor 1300 includes a first interwound winding (beginning at node 1302) and a second interwound winding (beginning at node 1310). The second nodes 1314 of the respective portions of the secondary winding 1300 are operably coupled to the AC ground reference potential, and the first nodes 1302, 1310 of the respective portions are coupled to receive a first differential input signal, the first taps 1304, 1308 of the first and second portion of the secondary winding 1300 may be operably coupled to receive a second differential input signal, and the second taps 1312, 1316 of the first and second portion may be operably coupled to receive a third differential signal.

Figure 14:
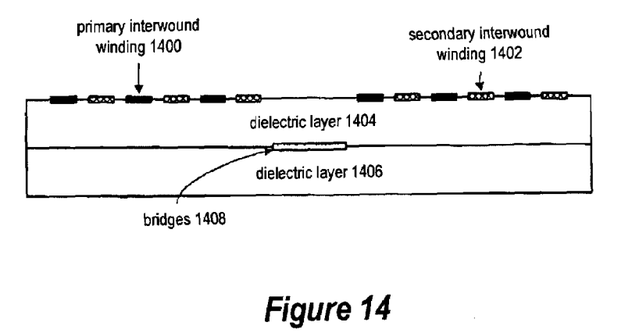
FIG. 14 is a cross sectional view of a single layer differential inductor in accordance with an illustrative embodiment of the present invention.

FIG. 14 illustrates a cross sectional view of a single layered multi-tap transformer inductor 1400. In this illustration, the primary and secondary interwound windings 1400 and 1402 are fabricated from a metallization layer lying on a first dielectric layer 1404. The first dielectric layer 1404 may be comprised of silicon oxide, or any other insulating integrated circuit material. The bridges 1408 are fabricated on a metallization layer that lies on the second dielectric layer 1406. As shown, the primary interwound winding 1400 and secondary interwound winding 1402 are interwound with respect to each other. This provides the desired magnetic coupling while minimizing the capacitance. The number of windings, the width of the windings, and the shape of the windings depend on the operating parameters under which the multi-tap transformer inductor will be required to perform. For example, with an operating frequency for the multi-tap transformer inductor that is less than half of the self-resonating frequency of the inductor, the acceptable capacitance and desired inductance may be derived. The quality factor (which typically improves the circuit performance with higher values) is based on the resistivity of the windings 1400, 1402. As such, the trace thickness for the windings 1400, 1402 is determined to provide the desired series resistance, and the windings are typically placed on the metal layer having the lowest resistivity. In this manner, the quality factor of the multi-tap transformer inductor may be optimized.

Figure 15:
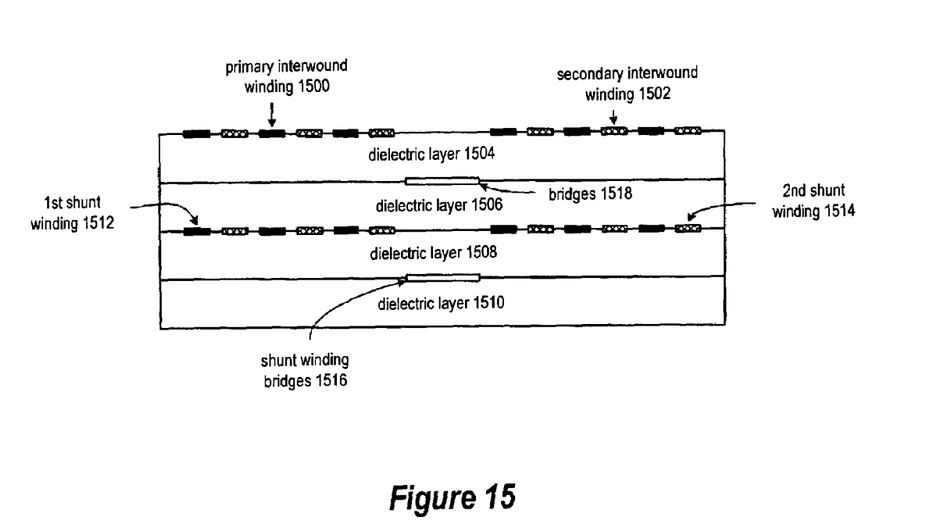
FIG. 15 is a cross sectional view of a shunted differential inductor in accordance with an illustrative embodiment of the present invention.

FIG. 15 illustrates a cross sectional view of an alternate multi-tap transformer inductor that includes shunt windings 1512 and 1514. In this illustration, the primary and secondary interwound windings 1500 and 1502 are on the first dielectric layer 1504. The corresponding bridges 1518 for the primary and secondary interwound windings 1500 and 1502 are on the second dielectric layer 1506. Two additional dielectric layers 1508 and 1510 may be used to implement the alternate multi-tap transformer for this embodiment. Dielectric layer 1508 supports the metallization layer that is used to fabricate a first shunt winding 1512 that is coupled in parallel with the primary interwound winding 1500. Similarly, the dielectric layer 1508 supports the second shunt winding 1514 that is coupled in parallel with the secondary interwound winding 1502. Dielectric layer 1510 supports the bridges 1516 used to fabricate the first and second shunt windings 1512 and 1514. By using the shunt windings 1512 and 1514, the quality factor may be further enhanced since the series resistance of the primary and secondary interwound windings 1500 and 1502 are reduced. As one of ordinary skill in the art will appreciate, additional shunt windings may be coupled in parallel with the primary and secondary interwound windings 1500 and 1502 to further increase the quality factor by reducing the series resistance.

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A power amplifier system, comprising:
 a plurality of power amplifiers comprising a first power amplifier and a second power amplifier, where each power amplifier receives an input signal and generates an output signal, and where any combination of the plurality of power amplifiers can be turned on at once;
 a multi-tap transformer comprising a secondary winding and a primary winding formed in an integrated circuit, where the primary winding is operably coupled to a shared load impedance, and where the secondary winding comprises a plurality of input taps, where each tap is operably coupled to receive an output signal from one of the plurality of power amplifiers.

2. The power amplifier system of claim 1, where each power amplifier comprises:
 an input transistor having a gate, a source, and a drain, wherein the gate is operably coupled to receive the input signal, and wherein the source is coupled to a first DC voltage potential;
 an inductor operably coupled between a second DC voltage potential and the drain of the input transistor, where the drain of the input transistor is operably coupled to an input tap of the secondary winding to provide the output signal from the power amplifier to the multi-tap transformer.

3. The power amplifier system of claim 1, wherein an input signal to a power amplifier is coupled through a tap of the multi-tap transformer to the shared load impedance to provide on-chip impedance matching between the power amplifier and the shared load impedance.

4. The power amplifier system of claim 1, wherein the plurality of power amplifiers comprise a plurality of differential power amplifiers.

5. The power amplifier system of claim 1, wherein the plurality of power amplifiers comprise a plurality of single ended amplifiers.

6. The power amplifier system of claim 1, where the load impedance comprises an antenna.

7. The power amplifier system of claim 1, where the secondary winding comprises a first portion and a second portion formed on an integrated circuit layer, wherein a first differential output signal from the first power amplifier is operably coupled between a first node of the first portion and a first node of the second portion; wherein a second differential output signal from the second power amplifier is operably coupled between a tap of the first portion and a tap of the second portion; and wherein a second node of the first portion and a second node of the second portion is operably coupled to a reference potential.

8. The power amplifier system of claim 1, wherein the plurality of power amplifiers and the multi-tap transformer are integrated on a single integrated circuit.

9. An on-chip multi-tap transformer for coupling a plurality of power amplifiers to a shared output impedance, comprising:

a primary winding formed on a first layer of an integrated circuit and operably coupled to a shared output impedance;

a secondary winding formed on a second layer of the integrated circuit, said secondary winding comprising a plurality of input taps, where each input tap is operably coupled to receive an output signal from one of a plurality of power amplifiers such that each input tap provides a different impedance level for connecting the power amplifier coupled to the input tap through to the shared impedance, and where any combination of the plurality of power amplifiers can be turned on at once.

10. The multi-tap transformer of claim 9, where the shared output impedance comprises an antenna.

11. The multi-tap transformer of claim 9, where the plurality of input taps comprises a first set of input taps for receiving a first differential input signal and a second set of input taps for receiving a second differential input signal.

12. The multi-tap transformer of claim 9, where the plurality of input taps comprises a reference input tap coupled to a reference potential, a first input tap for receiving a first single-ended input signal and a second input tap for receiving a second single-ended input signal.

13. The multi-tap transformer of claim 9, where the secondary winding comprises a common node, a first portion and a second portion, where each portion has one node, a first tap and a second tap.

14. The multi-tap transformer of claim 13, where the common node is operably coupled to a ground reference potential, the nodes from the first and second portions are operably coupled to receive a first differential input signal, the first taps of the first and second portions are operably coupled to receive a second differential input signal, and the second taps of the first and second portions are operably coupled to receive a third differential input signal.

15. The multi-tap transformer of claim 9, where the secondary winding has a generally octagonal geometric shape.

16. The multi-tap transformer of claim 9, where the secondary winding comprises a common node, a first portion and a second portion, where each portion has one node and multiple taps.

17. A method for efficiently delivering power to an output impedance through an on-chip multiple tap transformer, comprising:

connecting a multiple tap transformer output to an output impedance;

selectively coupling a plurality of power amplifiers to a corresponding plurality of multiple tap transformer inputs, where each multiple tap transformer input provides a predetermined load impedance for the power amplifier that is coupled to said multiple tap transformer input, thereby providing a multiple tap transformer having a variable load impedance, depending on which power amplifiers are turned on.

18. The method of claim 17 implemented on a single CMOS integrated circuit wireless communications device.

\* \* \* \* \*